US006074786A

United States Patent [19]

Chiang

[11] Patent Number: 6,074,786

[45] Date of Patent: Jun. 13, 2000

[54] RETICLE FOR ALIGNMENT AND PITCH DETERMINATION

[75] Inventor: Yung-Shu Chiang, Hsinchu, Taiwan

[73] Assignee: Taiwan Semiconductor Manufacturing Company, Hsin-Chu, Taiwan

[21] Appl. No.: 09/058,123

[22] Filed: Apr. 10, 1998

Related U.S. Application Data

[62] Division of application No. 08/620,199, Mar. 22, 1996, Pat. No. 5,770,337.

[51] Int. Cl.[7] ........ G03F 9/00

[52] U.S. Cl. ........ 430/5

[58] Field of Search ........ 430/5, 22, 30; 356/400, 401; 382/144

[56] References Cited

U.S. PATENT DOCUMENTS

| | | | |
|---|---|---|---|
| 4,383,757 | 5/1983 | Phillips | 355/53 |
| 4,558,949 | 12/1985 | Uehara et al. | 356/152 |
| 5,118,957 | 6/1992 | Kawashima et al. | 250/561 |
| 5,502,311 | 3/1996 | Imai et al. | 250/548 |

*Primary Examiner*—Christopher G. Young
*Attorney, Agent, or Firm*—George O. Saile; Stephen B. Ackerman; Graham S. Jones, II

[57] ABSTRACT

A reticle, for use in a stepper, and a method for using the reticle are provided. The reticle is used in performing the method for inspecting for the leveling of the reticle with respect to a semiconductor wafer being exposed by the stepper. Reticle alignment marks are used to measure reticle leveling by determining the degree of resolution at several sites on the semiconductor workpiece. The reticle can be patterned with a plurality of sets of alignment marks having an array of blocks which are in focus at different focal lengths. The alignment marks include marks located proximate to the corners of the reticle and proximate to the center of the reticle. Microscope measurements are made to determine the focal length at each set of alignment marks. Reticle pitch is determined at each workpiece position from the focal lengths measured at each alignment mark. The leveling can be checked repeatedly to obtain information for producing optimum focus of the reticle image on the workpiece.

14 Claims, 5 Drawing Sheets

RETICLE FOR ALIGNMENT AND PITCH DETERMINATION

This is a division of patent application Ser. No. 08/620,199, filing date Mar. 22, 1996, now U.S. Pat. No. 5,770,337, Method of Inspection to Determine Reticle Pitch, assigned to the same assignee as the present invention.

BACKGROUND OF THE INVENTION

1. Field of the Invention

This invention relates to equipment for manufacture of semiconductor devices using photolithographic masks/reticles for patterning wafers/substrates and to measurement of levels of the reticle relative to the wafer, and more particularly to leveling a mask used in a stepper.

2. Description of Related Art

In the manufacture of VLSI chips, the long term trend is that dimensions of the devices in the contemporary manufacturing environment are continuously shrinking to smaller and smaller dimensions. A problem arises as dimensions shrink more and more because the surface of a work-piece such as a semiconductor wafer with layers formed on the surface thereof is not flat. Thus, even assuming that a reticle held in a wafer stepper is perfectly flat, because of the lack of flatness of the surface of the workpiece surface there will be a variation in spacings between the reticle and the surfaces of the photolithographic material or other materials which lie immediately below the various parts of the "flat" reticle. These variations become increasingly more important at the dimensions shrink. For example, during exposure of the newly deposited photolithographic masking material formed on the workpiece, it is necessary in order to achieve anything close to a correct focus of the radiant energy which passes through the reticle to the workpiece, that the variations in levels of the workpiece surface relative to the reticle be minimized in the areas being exposed at a given time. Accordingly it is necessary to have a technique which affords the manufacturer an ability to determine the degree to which the reticle has been leveled relative to the surface of the workpiece below it so that adjustments can be made to correct the performance of the stepper.

Steppers are step-and-repeat lithographic system cameras in which a workpiece is exposed over and over by two dimensional translations of the workpiece beneath the reticle and the lens (if any) of the stepper which use a reticle as the object whose image is projected either directly in a 1:1 projection system or through a stepper lens upon the surface of a workpiece with the reduced image projected by the stepper. In the case of the reduced image system pattern transfer from the reticle to the mask on the wafer is accomplished by optically reducing the image to the correct dimensions while simultaneously focusing it onto a specified region of the wafer. After each exposure, the process continues with the wafer being translated to the next desired imaging position where the image is exposed again in the same way. The image is exposed, in that way, over and over again until the desired regions of the work-piece have been exposed with the image on the reticle. In each position of the workpiece, the process of leveling must be repeated to achieve the best possible focus of the reticle image upon the region of the workpiece being exposed.

Use has been made in the past of a line/space pattern to check stepper leveling performance. A problem with that approach is that a great deal of time is required to measure Critical Dimension (CD) value by means of Scanning Electron Microscopy (SEM.)

SUMMARY OF THE INVENTION

In accordance with the improved process of this invention an improved mask is employed with a resolution pattern with indicia thereon which can be read by a microscope to check stepper levelling performance.

In the manufacture of integrated circuits on a semiconductor workpiece an improved reticle adapted to permit inspecting to determine the degree to which a reticle is level by determining the degree of resolution at a plurality of sites on the semiconductor workpiece. The process comprises the steps of providing on the reticle a plurality of sets of alignment marks having an array of blocks which are in focus at different focal lengths. This permits measurement of the focus measured at each of the sets of alignment marks with a microscope. The pitch of the reticle is determined at each position of the workpiece by obtaining measurements of the focal lengths at each of the alignment marks. Stepper leveling can be checked to obtain information to produce optimum focus of the reticle image upon the workpiece region being exposed. Preferably, there are providing at least nine alignment marks on the workpiece. Alignment marks including three rows of alignment marks are located proximate to the corners of the reticle and proximate to the center of the reticle, preferably including three rows of alignment marks on the left side of the reticle, the center of the reticle and on the right side of said reticle. Marks in the center row are located 66.5 mm above and below the center of the reticle and left and right rows are 52.05 mm to the right and left of the center of the reticle. Marks on the corners of the reticle are 52.05 mm above and below the center of the reticle.

It is also preferred that the alignment marks include patterns which when in a best degree of focus provide a bright spot image in a microscope, and that each of the sets of alignment marks on the reticle have an array of blocks which are in focus at different focal lengths, including the steps of measuring at each of the sets of alignment marks which of the blocks is in focus at each of the alignment marks, and the alignment marks include alphanumeric and other patterns which when in a best degree of focus provide a bright spot image in a microscope.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT PROBLEM

The problem of this invention is to reduce the PM (Periodical Maintenance) time. Improved leveling performance takes a great deal of time to measure the Critical Dimension (CD) value by means of Scanning Electron Microscopy (SEM.)

Figure 3A:
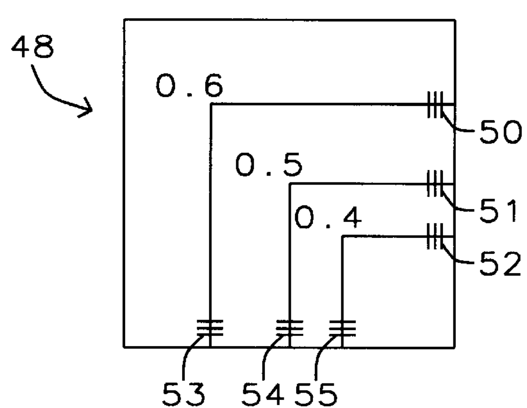
FIG. 3A shows a field with a less satisfactory arrangement of patterns which can be used for measuring with an SEM machine to get the best focus.

FIG. 3A shows a field with a less satisfactory arrangement of patterns which can be used for measuring with an SEM machine to get the best focus.

Figure 3B:
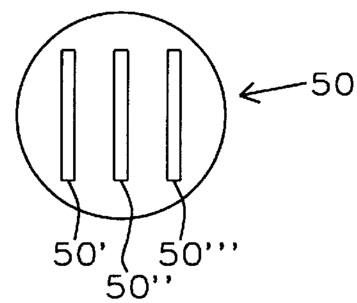
FIG. 3B is a magnified view of three markings and within an overall marking location.

FIG. 3B is a magnified view of three markings located within an overall marking location 50 in FIG. 3A.

A example of a process which uses excessive time is as follows:

1. Coat the workpiece with photoresist.

2. Expose the workpiece with a conventional mask with the pattern shown in FIGS. 3A and 3B with an array of field locations, e.g. 50, 51, 52, 53, 54 and 55.

3. Place the workpiece in a developer.

4. At each field location, e.g. 50, 51, 52, 53, 54 and 55 on the device, measure the line/space with an SEM machine to find the best focus at several positions, e.g. 5–9 positions, which can take on the order of 2 hours.

5. Go to next field to measure again at all the index positions (e.g. 9) and get the best focus.

6. For example in FIGS. 3A and 3B, measure at field locations 50, 51, 52, 53, 54 and 55.

7. Input these focus data to the stepper and the stepper compensates for the errors in these focus data.

8. Repeat steps 1–6 to provide assurance that the result is correct.

PREFERRED EMBODIMENT

The improved process of this invention employs an improved mask with a resolution pattern with indicia thereon which can be read by a microscope. The resolution pattern preferably includes a set of blocks with multiple focus heights having graduated focus heights which reflect a bright spot when in focus.

Procedure

1. Use a "leveling" reticle with a resolution pattern therein in FIGS. 1A and 1B to expose the focus/energy matrix. FIG. 1B is a magnified view of the markings located within an overall resolution pattern position F in FIG. 1A.

2. Read the focus with the resolution pattern on the calibration structures at nine (9) different index positions which represent the different lens positions. These focus data are the various focal plane heights at the different index positions.

3. According to the measurements at the nine (9) different index positions, one is enabled to calculate the stepper levelling performance and to make adjustments to the stepper.

A conventional commercially available stepper makes these calculations and makes the corrections.

Figure 1A:
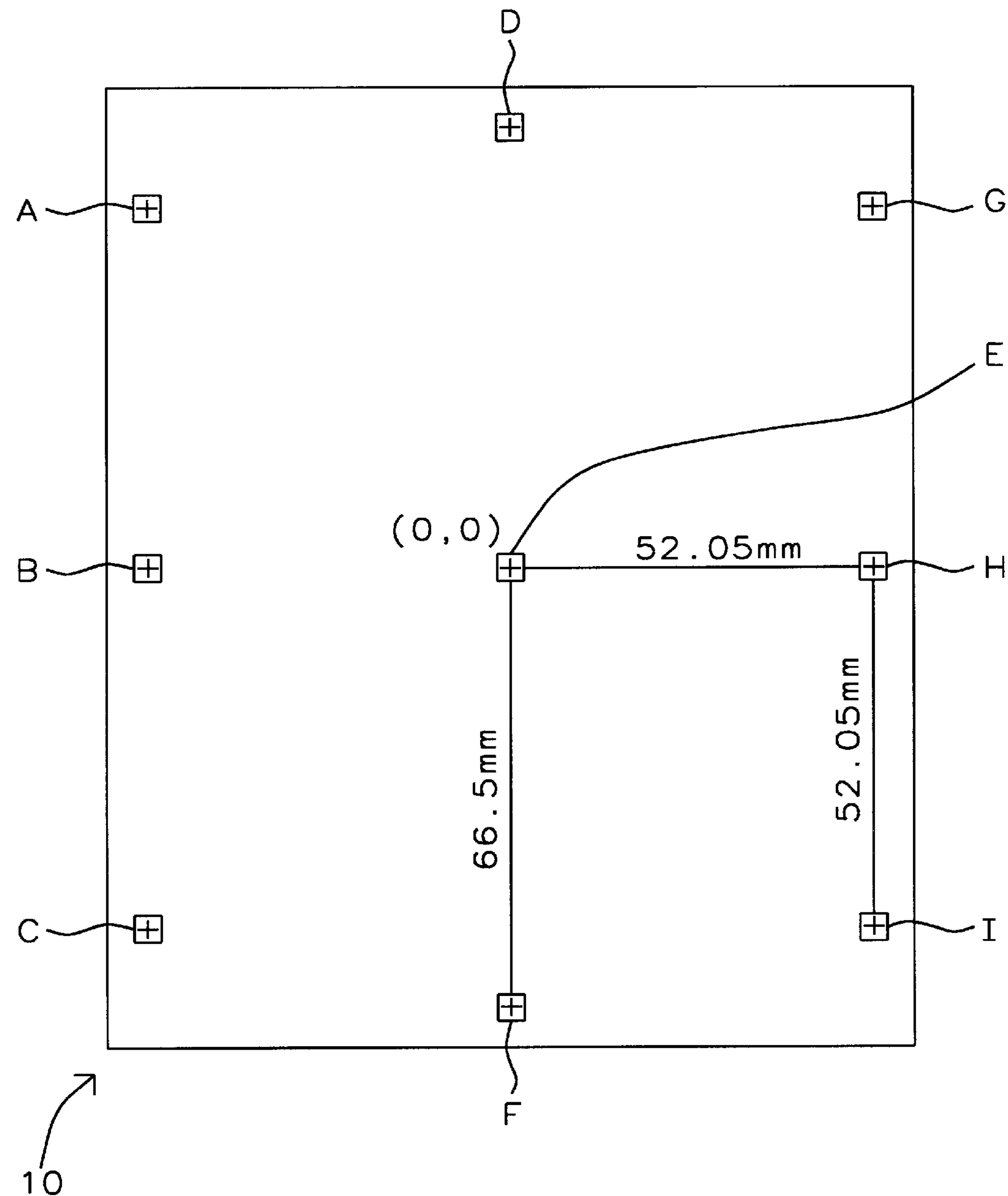
FIG. 1A shows a layout in accordance with this invention for a reticle carrying the pattern to be used to expose the photoresist which is deposited upon a workpiece.
Figure 1B:
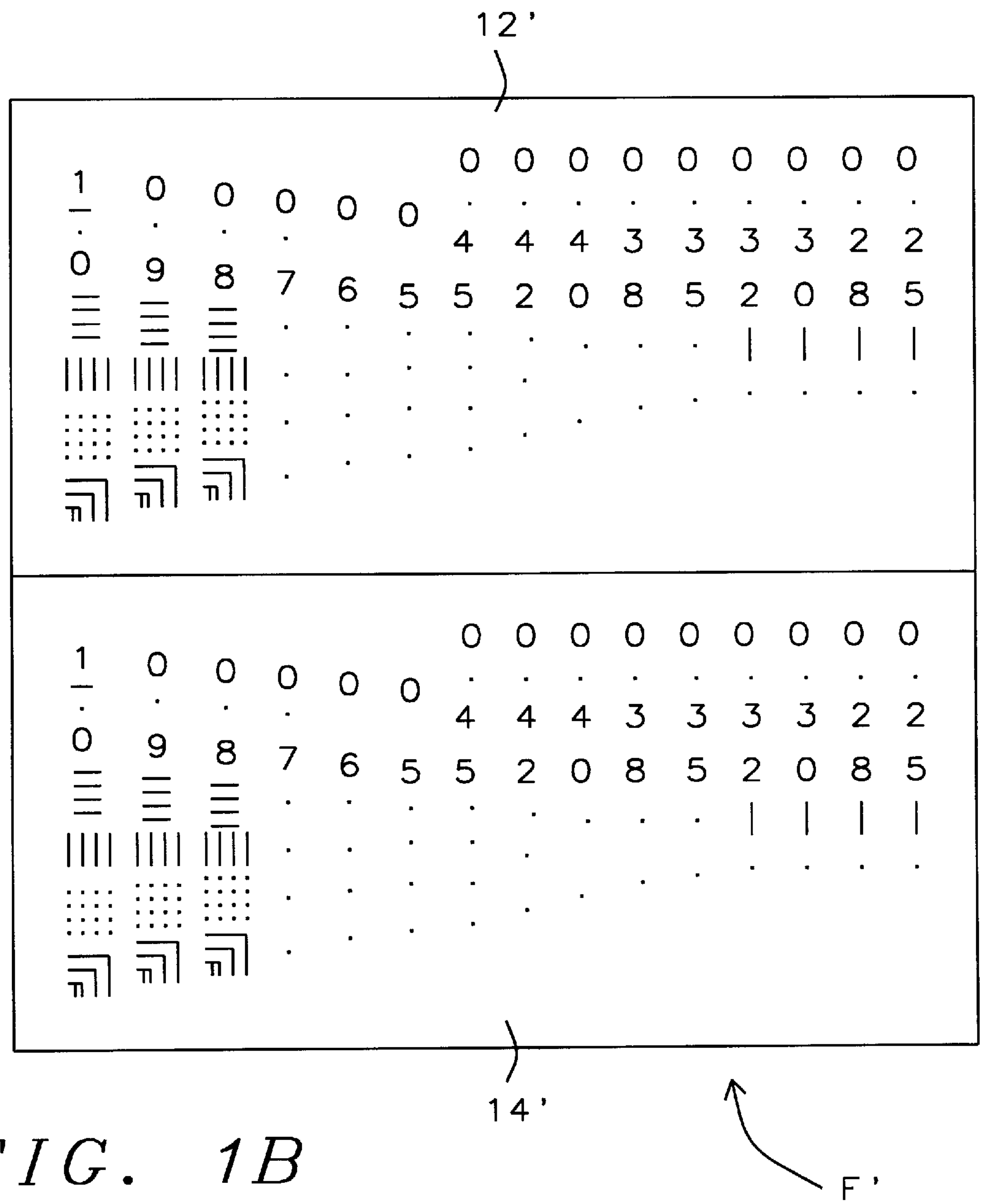
FIG. 1B is a blown up version of a matrix of patterns on the lower right of FIG. 1A illustrating an array of alphanumeric characters and marks which can be viewed through a microscope to provide a brighter image when the mark is in perfect focus.

FIG. 1A shows a layout in accordance with this invention for a rectangular reticle 10 carrying the pattern to be used to expose the photoresist which is deposited upon a workpiece, which is usually a semiconductor wafer. The reticle 10 is marked with a pattern to be exposed upon the unexposed photoresist which (during an initial stage of the process) has been applied to the surface of s semiconductor wafer. Reticle 10 which must be aligned and for that purpose it includes nine (9) different resolution pattern positions A, B, C, D, E, F, G, H and I. On the left side of the rectangular reticle 10 is located a left side column three resolution pattern positions including mark A, near the upper left corner, mark B in the center of the left side as well as mark C near the lower left corner of rectangular reticle 10. There are three additional resolution pattern positions located in a center column including mark D on the upper middle, mark E in the center of the rectangular reticle and mark F at the lower middle of rectangular reticle 10. Finally there are three additional resolution pattern positions located in a right side column including mark G at the upper right corner, mark H at the center of the right side and mark I on the lower right corner of rectangular reticle 10. The mark E is in the center of rectangular reticle 10. The marks D and F are located about 66.5 mm above and below the center of the reticle very near the margin of the top and the bottom of the rectangular reticle 10.

The reticle has dimensions of about 137 mm tall by about 105 mm wide.

The marks A, B and C are located about 52.05 mm to the left of the center mark E. The marks G, H and I are located about 52.05 mm to the right of the center mark E.

The marks A and G are located about 52.05 mm above the center mark E, whereas the marks C and I are located about 52.05 mm below the center mark E.

The lower middle mark F is shown in FIG. 1B in a blown up version of a matrix of patterns F' on the lower right of FIG. 1A to illustrate an array of alphanumeric characters and marks which can be viewed through a microscope to provide a brighter image when the mark F is in perfect focus. The alignment marks in pattern F' include patterns which, when in a best degree of focus, provide a bright spot image in a microscope. The matrix of patterns F' includes a black on white section 12 and a white on black section 14 (shown as black on white for convenience of illustration) below the section 12. In FIG. 2B, referring to column 30, each rectangle represents a different focus height from 3.0 $\mu$m to –3.0 $\mu$m. It is well known to those skilled in the art that for a pattern such as that shown in FIG. 1B, if a particular one of the rectangles 12' and 14' is in focus, then the spot viewed in the optical system is bright and complete, where FIG. 1B is a blown up version of a matrix of patterns on the lower right of FIG. 2B to illustrate an array of alphanumeric characters and marks which can be viewed through a microscope to provide a brighter image when the mark is in perfect focus which is usually a semiconductor wafer. On the other hand, if the rectangles 12' and 14' are out of focus the spot will disappear or will not be complete. According to theory, as proven by well known experiments, we can find the focus of column 30 in FIG. 2B by means of using this arrangement.

Figure 2A:
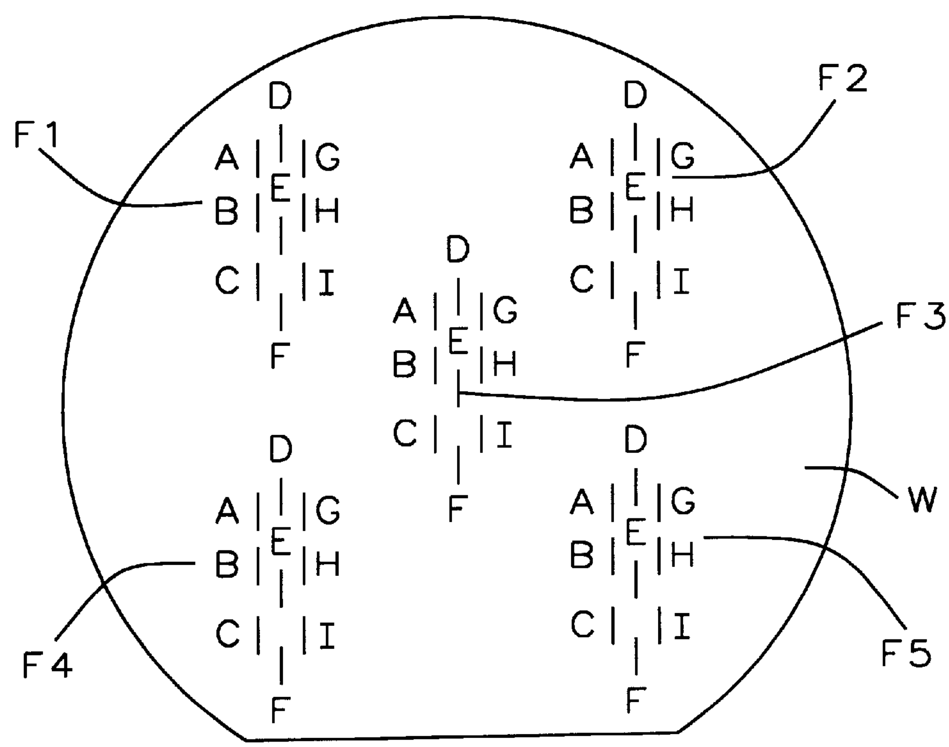
FIG. 2A shows a wafer with a set of fields on the wafer. Each field is composed of several resolution patterns, as shown in FIG. 1A.
Figure 2B:
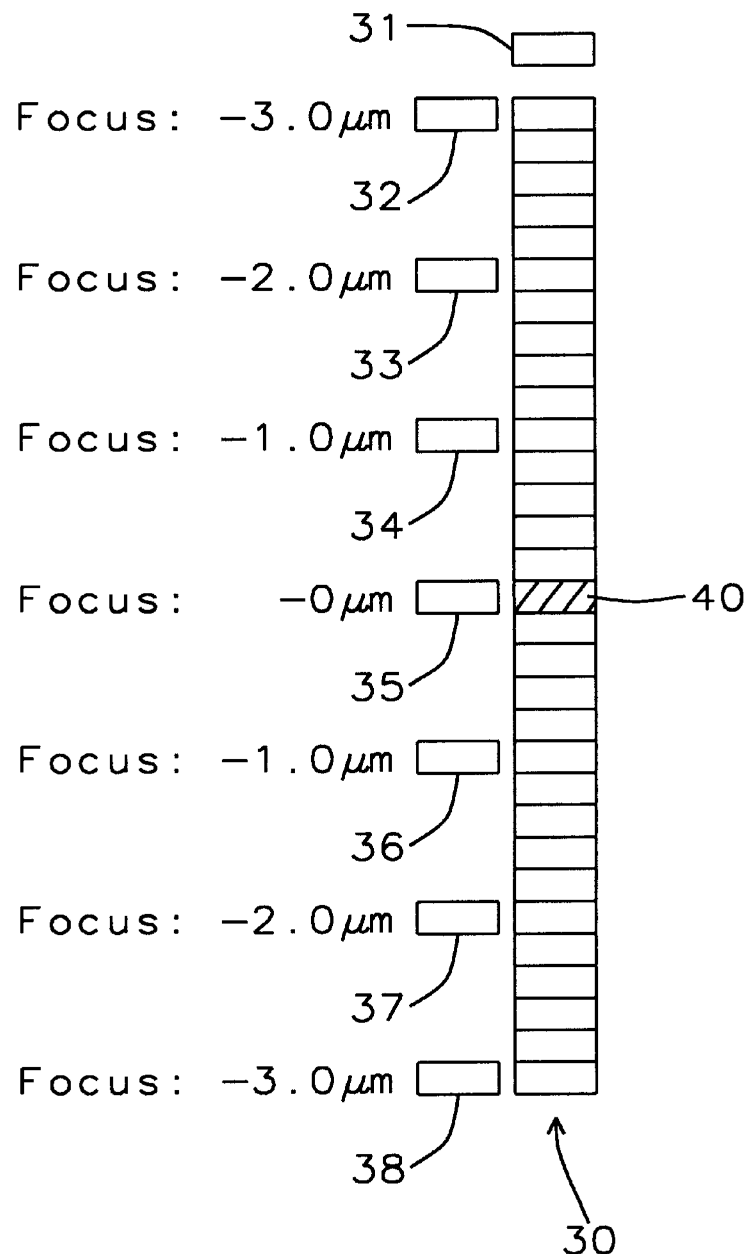
FIG. 2B shows a mark in a field exploded into a column of several blocks.

FIG. 2A shows a wafer W with a set of five fields F1, F2, F3, F4 and F5 located at the upper left, upper right, center lower left, and lower right, respectively. Each of the five fields is composed of nine resolution patterns A, B, C, D, E, F, G, H and I as shown in FIG. 1A.

FIG. 2B shows the F mark is field F3 exploded into a column 30 of thirty-one focus height blocks. The focus height blocks 30 includes a series of blocks with several of the thirty-one focus heights represented by the blocks listed in Table I below.

TABLE I

| Label | Focus Height | Block # |
|---|---|---|
| 32 | +3.0 μm | 1 |
| 33 | +2.0 μm | 6 |
| 34 | +1.0 μm | 11 |
| 35 | 0.0 μm | 16 |
| 36 | −1.0 μm | 21 |
| 37 | −2.0 μm | 26 |
| 38 | −3.0 μm | 31 |

The mark 40 in FIG. 2B is the same as the mark F' of FIG. 1B which shows an exploded view of two patterns 12' and 14'.

FIG. 3A shows a field 48 with a less satisfactory arrangement of patterns which can be used for measuring with an SEM machine to get the best focus. In the method of FIG. 3A, three sets of three parallel vertical markings at locations 50, 51 and 52 are located on 0.4, 0.5, and 0.6 orthogonal grid pattern lines along the y axis and three sets of three parallel horizontal markings at locations 53, 54, and 55 on the same orthogonal grid pattern lines along the x axis. FIG. 3B is a magnified view of the three markings 50', 50" and 50''' within overall marking location 50. The disadvantage of such a marking is that it is very small and that it is difficult to determine when it is in focus by use of a microscope.

Figure 4A:
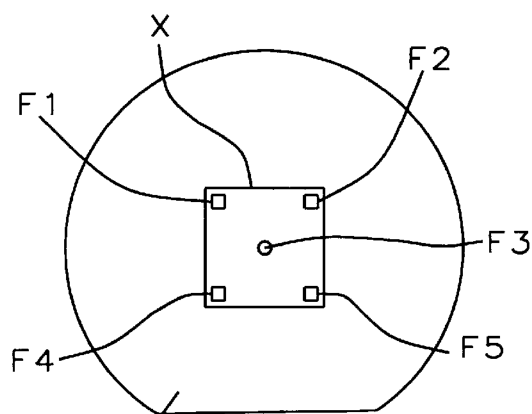
FIG. 4A shows a wafer W with a square chip location in the center of a wafer. The corners of the square are marked by chip field locations.

Referring in detail to FIG. 4A, a wafer W is shown with a square chip location X in the center of the wafer W. The corners of the square X are marked by field locations F1, F2, F4 and F5 with an additional field location F3 in the center of the chip C.

Figure 4B:
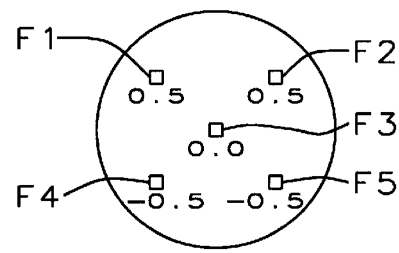
FIG. 4B shows a magnified view of the field locations of FIG. 4A.

FIG. 4B shows a magnified view of the location X showing the field locations F1, F2, F3, F4 and F5 with the locations F1, F2 0.5 μm above F3 which is at the "0" location. The locations F4 and F5 are at −0.5 μm below F3. Field locations F1 and F2 can be about 0.5 μm to the left of location F3 and locations F1 and F2 can be about 0.5 μm to the right of location F3.

Figure 5:
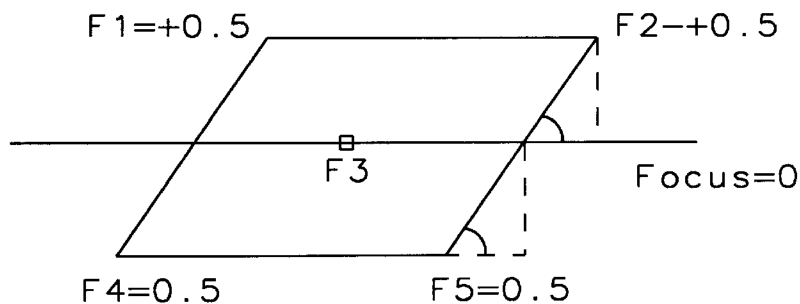
FIG. 5 illustrates a variation of FIG. 4B with the field locations located at the corners of a parallelogram.

FIG. 5 illustrates a variation of FIG. 4B with the field locations F1, F2, F3, F4 located at the corners of a parallelogram. According to the focus of F1 to F5, we can determine the leveling performance on a wafer. The value at locations F1, F2 are 0.5 μm above F3 which is at the "0" location. The locations F4 and F5 are at −0.5 μm below F3.

Procedure

Steps of the procedure in accordance with this invention are as follows:

1) Using the column 30 type of mark, we can find the focus of position F at location F3 in FIG. 2A.

2) Using the same method, we can find the focus of the nine positions A, B, C, D, E, G, H, I at location F3.

3) According to the focus of the nine positions A–I at location F3 (i.e. Fn, where n=3) we can find the leveling performance.

4) In FIG. 2A, F1–F5 (i.e. Fn, where n=1, 2, 3, 4, or 5) have the same purpose. The advantage is that the additional field data can eliminate reading errors.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A reticle for use in the manufacture of integrated circuits on a semiconductor workpiece adapted for inspection to determine the degree to which a reticle in a stepper is level by determining the degree of resolution at a plurality of sites on said semiconductor workpiece comprising:

said reticle including a plurality of sets of alignment marks having an array of blocks which are in focus at different focal lengths, said reticle having a center, a set of said alignment marks located proximate to each of the corners of said reticle, a set of said alignment marks proximate to said center of said reticle, and said alignment marks including patterns which when in a best degree of focus provide a bright spot image in a microscope, said alignment marks being adapted for use in determining the pitch of said reticle at each position of the workpiece by obtaining measurements of the focal lengths at each of said alignment marks, and said alignment marks being adapted for checking leveling repeatedly to obtain information for producing optimum focus of the reticle image upon the region of the workpiece being exposed.

2. A reticle in accordance with claim 1 wherein:

said marks in said center are located 66.5 mm above and below said center of said reticle, and marks located on the left and right, 52.05 mm to the right and left of said center of said reticle, with the marks on the corners of said reticle 52.05 mm above and below said center of said reticle.

3. A reticle in accordance with claim 1 including:

each of said sets of alignment marks on said reticle has an array of blocks which are in focus at different focal lengths.

4. A reticle in accordance with claim 1 including:

said marks in said center are located 66.5 mm above and below said center of said reticle marks located on the left and right, 52.05 mm to the right and left of said center of said reticle, with the marks on the corners of said reticle 52.05 mm above and below said center of said reticle, and each of said sets of alignment marks on said reticle has an array of blocks which are in focus at different focal lengths.

5. A reticle in accordance with claim 1 wherein said alignment marks include alphanumeric and other patterns which when in a best degree of focus provide said bright spot image in a microscope.

6. A reticle for use in the manufacture of integrated circuits on a semiconductor workpiece mean adapted for inspecting to determine the degree to which a rectangular reticle with four corners and a center is level by determining the degree of resolution at a plurality of sites on said semiconductor workpiece comprising:

providing at least nine sets of alignment marks on said workpiece, said nine sets of alignment marks including three horizontal rows of sets of alignment marks, said rows including a top row, a middle row and a bottom row, said top row including three sets of alignment marks comprising a first set of alignment marks proximate to the upper left corner of said reticle, a second set of alignment marks proximate to said center of said reticle along the top edge thereof and a third set of alignment marks proximate to the upper right corner of said reticle, said middle row including three sets of alignment marks comprising a first set of alignment marks proximate to the left edge of said reticle, a second set of alignment marks proximate to said center of said reticle and a third set of alignment marks proximate to the right edge of said reticle, and said bottom row including three sets of alignment marks comprising a first set of alignment marks proximate to the lower left corner of said reticle, a second set of alignment marks proximate to said center of said reticle along the bottom edge thereof and a third set of alignment marks proximate to the lower right corner of said reticle, said alignment marks being adapted for use in measuring the focus at each of said sets of alignment marks, said alignment marks being adapted for use in determining the pitch of said reticle at each position of the workpiece by obtaining measurements of the focal lengths at each of said alignment marks, and said alignment marks being adapted for checking leveling repeatedly to obtain information for producing optimum focus of the reticle image upon the region of the workpiece being exposed.

7. A reticle in accordance with claim 6 wherein:

said alignment marks include patterns which when in a best degree of focus provide a bright spot image in a microscope.

8. A method in accordance with claim 6 wherein:

said sets of alignment marks in said center comprise alignment marks located 66.5 mm above and below said center of said reticle, said marks on the left and right are located 52.05 mm to the right and left of said center of said reticle, and said marks on the corners of said reticle are located 52.05 mm above and below said center of said reticle.

9. A reticle in accordance with claim 6 including:

each of said sets of alignment marks on said reticle having an array of blocks which are in focus at different focal lengths, and said blocks being adapted for use in measuring at each of said sets of alignment marks which of said blocks is in focus at each of said alignment marks.

10. A reticle in accordance with claim 6 including:

said marks in said center are located 66.5 mm above and below said center of said reticle marks located on the left and right, 52.05 mm to the right and left of said center of said reticle, with the marks on the corners of said reticle 52.05 mm above and below said center of said reticle, and said alignment marks including patterns which when in a best degree of focus provide a bright spot image in a microscope.

11. A reticle in accordance with claim 6 wherein said alignment marks include alphanumeric and other patterns which when in a best degree of focus provide said bright spot image in a microscope.

12. A reticle in accordance with claim 10 wherein said alignment marks include alphanumeric and other patterns which when in a best degree of focus provide said bright spot image in a microscope.

13. A reticle for use in the manufacture of integrated circuits on a semiconductor workpiece mean adapted for inspecting to determine the degree to which a rectangular reticle with four corners and a center is level by determining the degree of resolution at a plurality of sites on said semiconductor workpiece comprising:

providing at least nine sets of alignment marks on said workpiece, said nine sets of alignment marks including three horizontal rows of sets of alignment marks, said rows including a top row, a middle row and a bottom row, said top row including three sets of alignment marks comprising a first set of alignment marks proximate to the upper left corner of said reticle, a second set of alignment marks proximate to said center of said reticle along the top edge thereof and a third set of alignment marks proximate to the upper right corner of said reticle, said middle row including three sets of alignment marks comprising a first set of alignment marks proximate to the left edge of said reticle, a second set of alignment marks proximate to said center of said reticle and a third set of alignment marks proximate to the right edge of said reticle, and said bottom row including three sets of alignment marks comprising a first set of alignment marks proximate to the lower left corner of said reticle, a second set of alignment marks proximate to said center of said reticle along the bottom edge thereof and a third set of alignment marks proximate to the lower right corner of said reticle, said alignment marks being adapted for use in measuring the focus at each of said sets of alignment marks, said alignment marks being adapted for use in determining the pitch of said reticle at each position of the workpiece by obtaining measurements of the focal lengths at each of said alignment marks, and said alignment marks being adapted for checking leveling repeatedly to obtain information for producing optimum focus of the reticle image upon the region of the workpiece being exposed, said sets of alignment marks in said center comprise alignment marks located 66.5 mm above and below said center of said reticle, said marks on the left and right are located 52.05 mm to the right and left of said center of said reticle, said marks on the corners of said reticle are located 52.05 mm above and below said center of said reticle, and said alignment marks include patterns which when in a best degree of focus provide a bright spot image in a microscope.

14. A reticle in accordance with claim 13 wherein said alignment marks include alphanumeric and other patterns which when in a best degree of focus provide said bright spot image in a microscope.

* * * * *